United States Patent [19]
Leibovitz et al.

[11] Patent Number: 6,011,314
[45] Date of Patent: *Jan. 4, 2000

[54] REDISTRIBUTION LAYER AND UNDER BUMP MATERIAL STRUCTURE FOR CONVERTING PERIPHERY CONDUCTIVE PADS TO AN ARRAY OF SOLDER BUMPS

[75] Inventors: Jacques Leibovitz; Park-Kee Yu, both of San Jose; Ya Yun Zhu; Maria L. Cobarruviaz, both of Cupertino; Susan J. Swindlehurst, Redwood City; Cheng-Cheng Chang; Kenneth D. Scholz, both of Palo Alto, all of Calif.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/241,221

[22] Filed: Feb. 1, 1999

[51] Int. Cl.[7] ........................... H01L 23/48; H01L 23/52; H01L 29/40
[52] U.S. Cl. ........................ 257/781; 257/760; 257/751; 257/779
[58] Field of Search ............................ 257/780, 781, 257/758, 763, 751, 766, 765, 767, 771, 779

[56] References Cited

U.S. PATENT DOCUMENTS

| | | | |
|---|---|---|---|
| 5,327,013 | 7/1994 | Moore et al. | 257/780 |
| 5,547,740 | 8/1996 | Higdon et al. | 428/209 |
| 5,604,379 | 2/1997 | Mori | 257/780 |
| 5,719,448 | 2/1998 | Ichikawa | 257/781 |
| 5,726,500 | 3/1998 | Duboz et al. | |

*Primary Examiner*—Sheila V. Clark
*Attorney, Agent, or Firm*—Brian R. Short

[57] ABSTRACT

An integrated circuit redistribution structure. The integrated circuit redistribution structure includes a plurality of conductive pads located on an active side of an integrated circuit. The integrated circuit redistribution structure includes a redistribution layer and an under bump material structure for receiving a solder bump. The redistribution layer can include a first mechanically protective layer which adheres to the active side of the integrated circuit. The redistribution layer includes a plurality of conductive lines in which at least one of the conductive lines is connected to at least one conductive pad. Each conductive line includes an adhesion and diffusion barrier layer, an electrical conductor layer, and a first metallic protective layer. The under bump material structure is formed over at least one conductive line. The under bump material structure includes a solder wettable metal layer formed over the redistribution layer, and a second metallic protective layer for receiving the solder bump.

19 Claims, 4 Drawing Sheets

REDISTRIBUTION LAYER AND UNDER BUMP MATERIAL STRUCTURE FOR CONVERTING PERIPHERY CONDUCTIVE PADS TO AN ARRAY OF SOLDER BUMPS

FIELD OF INVENTION

This invention relates generally to electrically connecting solder bumps to conductive pads of an integrated circuit. In particular, it relates to a structure and method of forming a redistribution layer and an under bumping material layer which allows the solder bumps to be electrically connected to the conductive pads of the integrated circuit while being formed over the integrated circuit at positions different than the locations of the conductive pads.

BACKGROUND

Historically, integrated circuits have been formed on the surface of silicon substrates with conductive pads formed at the periphery of the silicon substrates. Generally, wire bonds are attached to the conductive pads which provide electrical connections from the conductive pads to pads on a package substrate.

Increasing complexity of electronic circuitry included on integrated circuits has required an increase in the number of input and output connections to integrated circuits. The increase in the input and the output connections has required input and output conductive pads to be formed more closely together. That is, the pitch between the conductive pads which are used as inputs and outputs to the integrated circuits has decreased with increased circuit complexity.

The reduction in the pitch between the input and output conductive pads of integrated circuits has required a wire bonding interconnection structure in which the bonding wires are narrower in width and longer in length. However, reduced pitch is not enough and the increasing number of input and output connections requires more rows of connections on the package substrate around the integrated circuit which requires longer bonding wires.

Increasing the length of the bonding wires can cause the bonding wires to suffer electrical and mechanical performance limitations. First, longer bonding wires generally include a greater amount of inductance. Increasing the inductance of a bonding wires reduces the speed of electronic signals which pass through the bonding wires. In addition, increasing the length of bonding wires reduces the mechanical stability of the bonding wires which can vibrate and short, at least temporarily among themselves.

The inductance of the electrical connections can be reduced by replacing the wire bonds with "solder bumps" which are formed on the conductive pads. In addition, solder bumps are generally more mechanically stable than wire bonds. Solder bumps, however, require greater conductive pad spacing or pitch than wire bonds. That is, wire bonds can generally be formed closer together than solder bumps. Therefore, it can be difficult to form solder bumps on conductive pads which were formed with the expectation that wire bonds would be used to provide electrical connections to the conductive pads.

Locating the conductive pads at the interior of the silicon substrate surface rather than the periphery allows the conductive pads to be physically spaced further apart. Therefore, the number of solder bumps electrically interconnected to the integrated circuit substrate can be increased. However, many integrated circuit designs exist in which the conductive pads are located at the periphery of the silicon substrate. The expense to retool the design process of the integrated circuit so that the conductive pads are located at the interior of the silicon substrate surface can be very large. That is, redesigning the integrated circuit so that the conductive pads are located at the interior of the silicon substrate surface can be prohibitively expensive.

It is desirable to have a structure and method for interconnecting conductive pads located at the periphery of an integrated circuit to solder bumps formed at the interior of a silicon substrate surface.

SUMMARY OF THE INVENTION

The present invention is a structure and method for interconnecting conductive pads located at the periphery of an integrated circuit on a silicon substrate to solder bumps formed at the interior of the silicon substrate surface. The apparatus and method include a redistribution layer and an under bump material structure which electrically connect the conductive pads to the solder bumps.

A first embodiment of the invention includes an integrated circuit redistribution structure. The integrated circuit redistribution structure includes a plurality of conductive pads located on an active side of an integrated circuit. The integrated circuit redistribution structure includes a redistribution layer and an under bump material structure for receiving a solder bump. The redistribution layer includes a plurality of conductive lines in which at least one of the conductive lines is connected to at least one conductive pad. Each conductive line includes an adhesion and diffusion barrier layer, an electrical conductor layer, and a first metallic protective layer. The under bump material structure is formed over at least one site on at least one conductive line. The under bump material structure includes a solder wettable metal layer formed over the corresponding site of the redistribution layer, and a second metallic protective layer for receiving the solder bump.

A second embodiment of the invention is similar to the first embodiment. The redistribution layer of the second embodiment further includes a first mechanically protective layer adhering to the active side of the integrated circuit. The first mechanically protective layer includes apertures corresponding to the conductive pads which allow electrical connections between the conductive lines and the conductive pads.

A third embodiment of the invention is similar to the first embodiment. The third embodiment includes a second mechanically protective layer adhering to the redistribution layer. The second mechanically protective layer includes apertures corresponding to the under bump material structure allowing an electrical connection between the conductive lines and the solder bump.

Other aspects and advantages of the present invention will become apparent from the following detailed description, taken in conjunction with the accompanying drawings, illustrating by way of example the principles of the invention.

DETAILED DESCRIPTION

Figure 1:
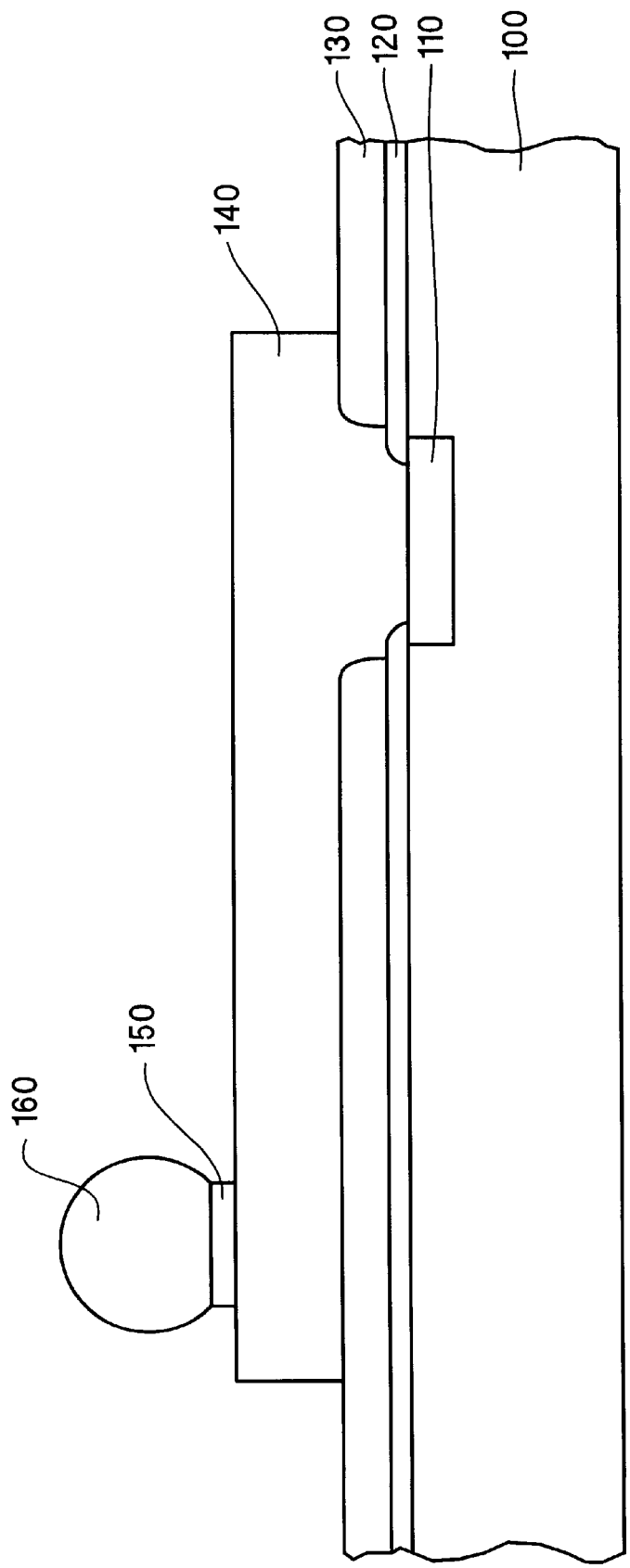
FIG. 1 shows an embodiment of the invention.

As shown in the drawings for purposes of illustration, the invention is embodied in a structure and method for interconnecting conductive pads located at the periphery of an integrated circuit to solder bumps formed at the interior of the integrated circuit. The structure and method include a redistribution layer and an under bump material structure which electrically connect the conductive pads to the solder bumps.

FIG. 1 shows a first embodiment of the invention. This embodiment includes an integrated circuit redistribution structure which electrically interconnects a conductive pad 110 of a substrate 100 to a solder bump 160. The redistribution structure includes a redistribution layer and an under bump material structure 150.

The redistribution layer includes at least one conductive line 140 which is electrically connected to the conductive pad 110. The redistribution layer may further include a first mechanically protective layer 130 which is formed over a passivation layer 120 of the substrate 100.

The under bump material structure 150 electrically connects the solder bump 160 to the conductive line 140. The under bump material structure 150 is formed over the conductive line 140 and receives the solder bump 160.

Figure 2:
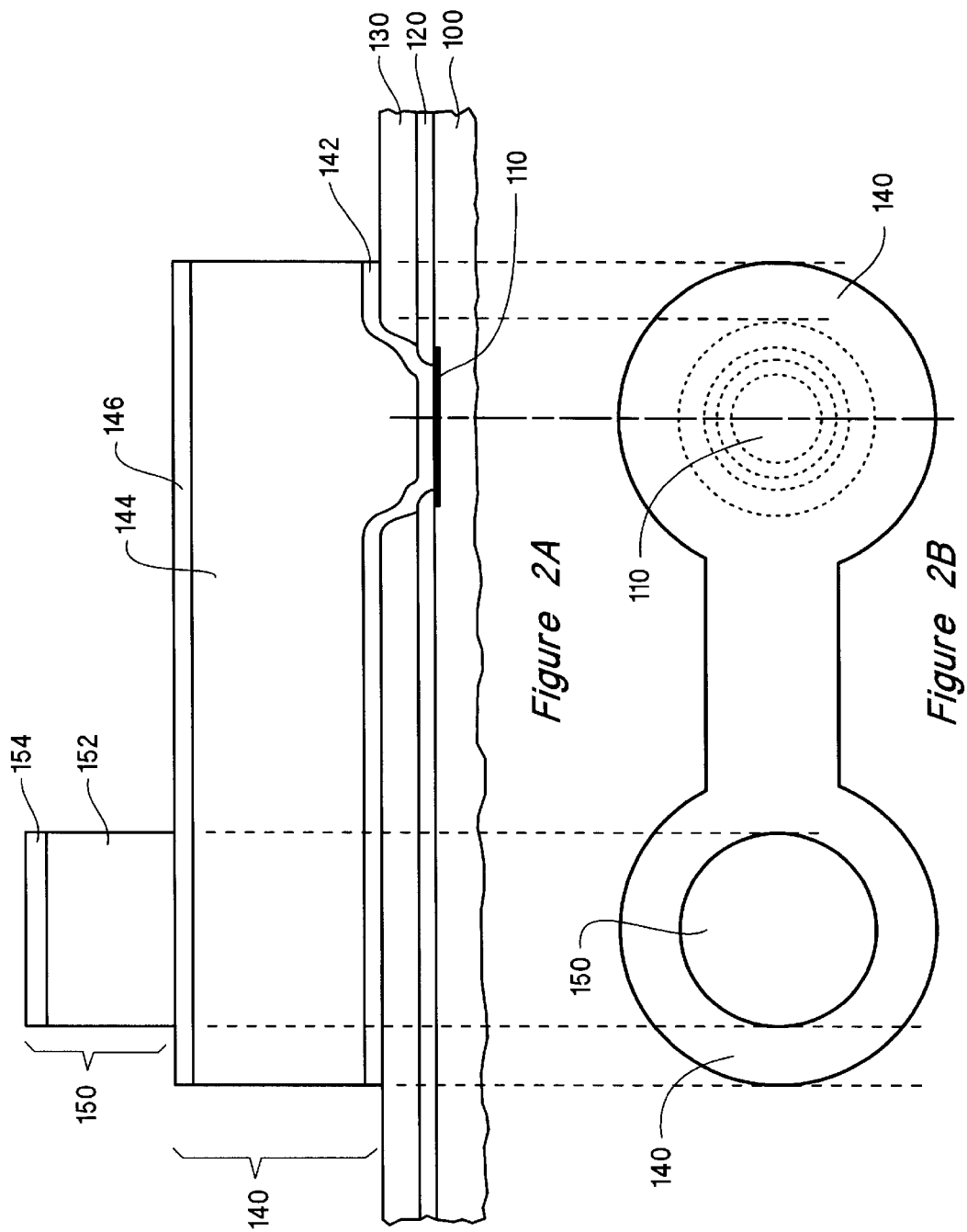
FIG. 2A shows a cross-sectional view depicting greater detail of the redistribution lines and under bumping material of an embodiment of the invention.
FIG. 2B shows a top view of the redistribution lines and under bumping material of an embodiment of the invention.

FIG. 2A shows a cross-sectional view of an embodiment of the redistribution layer and the under bump material structure 150 according to the invention. The conductive line 140 of the redistribution layer includes an adhesion and diffusion barrier layer 142, an electrical conductor layer 144 and a first metallic protective layer 146. The under bump material structure 150 includes a solder wettable metal layer 152 formed over the redistribution layer and a second metallic protective layer 154 for receiving the solder bump 160.

FIG. 2B is a top-view of the embodiment shown in FIG. 2A. The conductive line 140 extends over the substrate 100 connecting a conductive pad 110 of the substrate 100 to under bump material structure 150. The under bump material structure 150 electrically connects the conductive line 140 to the solder bump 160.

The first mechanically protective layer 130 is formed over the passivation layer 120. The first mechanically protective layer 130 protects the passivation layer 120 from destructive forces which could otherwise create cracks in the passivation layer 120. For example, the solder bump 160 can be formed by depositing solder by evaporation through a hard metal mask. The passivation layer 120 can be scratched during alignment of the hard metal mask over the substrate 100. The first mechanically protective layer 130 can be formed from polyimide. The first mechanically protective layer 130 may also protect the passivation layer 120 from chemical attack during processing. Typically, the first mechanically protective layer 130 does not cover the edge of the passivation layer 120 at the conductive pad 110. However, an embodiment of the invention includes the first mechanically protective layer 130 covering the edge of the passivation layer 120 at the conductive pad 110. The first mechanically protective layer 130 is typically about 4 microns thick.

The conductive line 140 of the redistribution layer can be formed over the first mechanically protective layer 130 or directly over the passivation layer 120 if the first mechanically protective layer 130 is not formed. The conductive line 140 includes an adhesion and diffusion barrier layer 142, electrical conductor layer 144 and a first metallic protective layer 146.

The adhesion and diffusion barrier layer 142 can be formed over the first mechanically protective layer 130 or the passivation layer 120. The adhesion and diffusion barrier layer 142 provides several functions. First, the adhesion and diffusion barrier layer 142 prevents mobile metal atoms or ions from reaching the integrated circuit substrate active devices. Second, the adhesion and diffusion barrier layer 142 adheres to the electrical conductive layer 144, the conductive pads 110, the first mechanically protective layer 130 and in some cases the passivation layer 120.

The adhesion and diffusion barrier layer 142 must be conductive. The adhesion and diffusion barrier layer 142 should generally be between 300 to 1500 Angstroms thick. The adhesion and diffusion barrier layer 142 can be formed from Ti, TiW, Cr or other materials having similar characteristics.

The electrical conductor layer 144 is formed over the adhesion and diffusion barrier layer 142. The electrical conductor layer 144 must be a good conductor, should be inexpensive and provide adhesion between the adhesion and diffusion barrier layer 142 and the first metallic protective layer 146. Typically, the electrical conductor layer 144 is formed from an Al—Cu alloy. The electrical conductor layer 144 can also be formed from Al or Cu. However, an electrical conductor layer 144 formed from Al is more likely than an Al—Cu alloy to suffer from the formation of hillocks. Hillocks are protuberances which occur on the surface of the electrical conductor layer 144 during thermal processing. The electrical conductor layer 144 is typically 1 to 2 microns thick.

The first metallic protective layer 146 is formed over the electrical conductor layer 144. The first metallic protective layer 146 helps prevent the formation of hillocks if the electrical conductor layer 144 is formed from an Al—Cu alloy. The first metallic protective layer 146 protects the electrical conductor layer 144 from corrosion if the electrical conductor layer 144 is formed from copper. If the electrical conductor layer 144 is formed from copper, the first metallic protective layer 146 forms a non-solder-wettable surface over the electrical conductor layer 144. The first metallic protective layer 146 can be formed from Ti, TiW, Cr or other materials having similar characteristics. The first metallic protective layer 146 is typically between 300 to 1500 Angstroms thick.

The under bump material structure 150 includes a solder wettable metal layer 152 formed over the redistribution layer and a second metallic protective layer 154 for receiving the solder bump 160.

The solder wettable metal layer 152 should be wettable by solder when solder deposited on the solder wettable metal layer 152 is reflowed. The solder wettable metal layer 152 should adhere to the second metallic protective layer 154. The solder wettable metal layer 152 should act as a barrier to prevent solder from reaching the second metallic protective layer 154 upon multiple reflows of the solder. The solder wettable metal layer 152 can be formed from Ni, NiV or a Ni alloy. The solder wettable metal layer 152 is typically between 2000 and 8000 Angstroms thick.

The second metallic protective layer 154 is formed over the solder wettable metal layer 152. The second metallic protective layer 154 prevents corrosion of the solder wettable metal layer 152 when the solder wettable metal layer 152 is formed from Ni. The second metallic protective layer 154 is generally formed from Au. The second metallic protective layer 154 may be formed from Cu when the solder of the solder bumps is deposited by printing solder paste. The second metallic protective layer 154 typically is between 300 and 800 Angstroms thick if formed from Au, and about 1 micron thick if formed from Cu.

It should be understood that FIG. 1, FIG. 2A and FIG. 2B are not drawn to scale.

Figure 3:
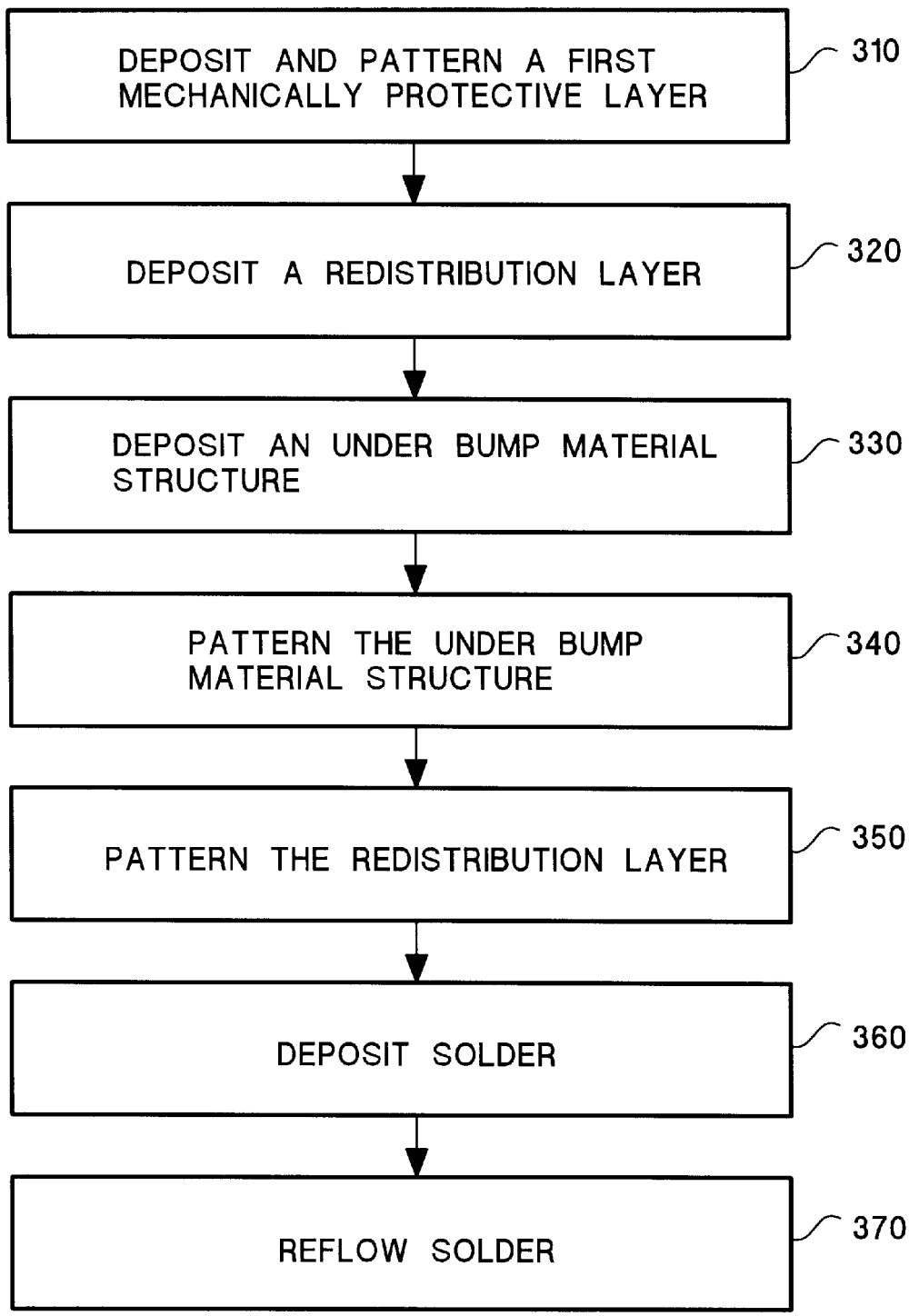
FIG. 3 is a flow chart showing steps of a method of forming an embodiment of the invention.

FIG. 3 is a flow chart showing the steps of a method of forming an embodiment of the invention.

A first step 310 includes depositing and patterning a first mechanically protective layer on an integrated circuit substrate. The first mechanically protective layer can be patterned by depositing and lithographically patterning a photoresist layer over the first mechanically protective layer. The first mechanically protective layer is then etched. As previously mentioned, the first mechanically protective layer is generally formed from polyimide. Alternatively, the first mechanically protective layer is formed by depositing a layer of photosensitive polyimide which is subsequently photolithographically patterned.

A second step 320 includes depositing a redistribution layer over the first mechanically protective layer. As previously stated, the redistribution layer includes a conductive line. The conductive line of the redistribution layer includes an adhesion and diffusion barrier layer, an electrical conductor layer and a first metallic protective layer. The adhesion and diffusion barrier layer, the electrical conductor layer and the first metallic protective layer can each be deposited through evaporation or sputtering. Deposition through evaporation and sputtering are well known in the art of semiconductor fabrication. As previously mentioned, the adhesion and diffusion barrier layer can be formed from Ti, TiW, Cr or other materials having similar characteristics. For the method of FIG. 3, the electrical conductor layer is typically formed from an Al—Cu alloy or Al. As previously mentioned, the first metallic protective layer can be formed from Ti, TiW, Cr or other materials having similar characteristics.

A third step 330 includes depositing an under bump material structure. As previously stated, the under bump material structure includes a solder wettable metal layer formed over the redistribution layer and a second metallic protective layer. The solder wettable metal layer and the second metallic protective layer can be deposited through evaporation or sputtering. As previously stated, the solder wettable metal layer can be formed from Ni, NiV or a Ni alloy, and the second metallic protective layer can be formed from Au.

A fourth step 340 includes patterning the under bump material structure. The under bump material structure can be patterned by depositing and lithographically patterning a photoresist layer over the under bump material structure. The under bump material structure is then etched.

A fifth step 350 includes patterning the redistribution layer. The redistribution layer can be patterned by depositing and lithographically patterning a photoresist layer over the redistribution layer. The redistribution layer is then etched.

A sixth step 360 includes depositing solder. The solder is deposited on the under bump material structure where solder bump are to be formed. The solder can be deposited by electroplating, evaporation or by printing a solder paste. These methods of depositing solder are well known in the art of semiconductor processing.

A seventh step 370 includes reflowing the deposited solder forming a solder bump on the under bump material structure.

Figure 4:
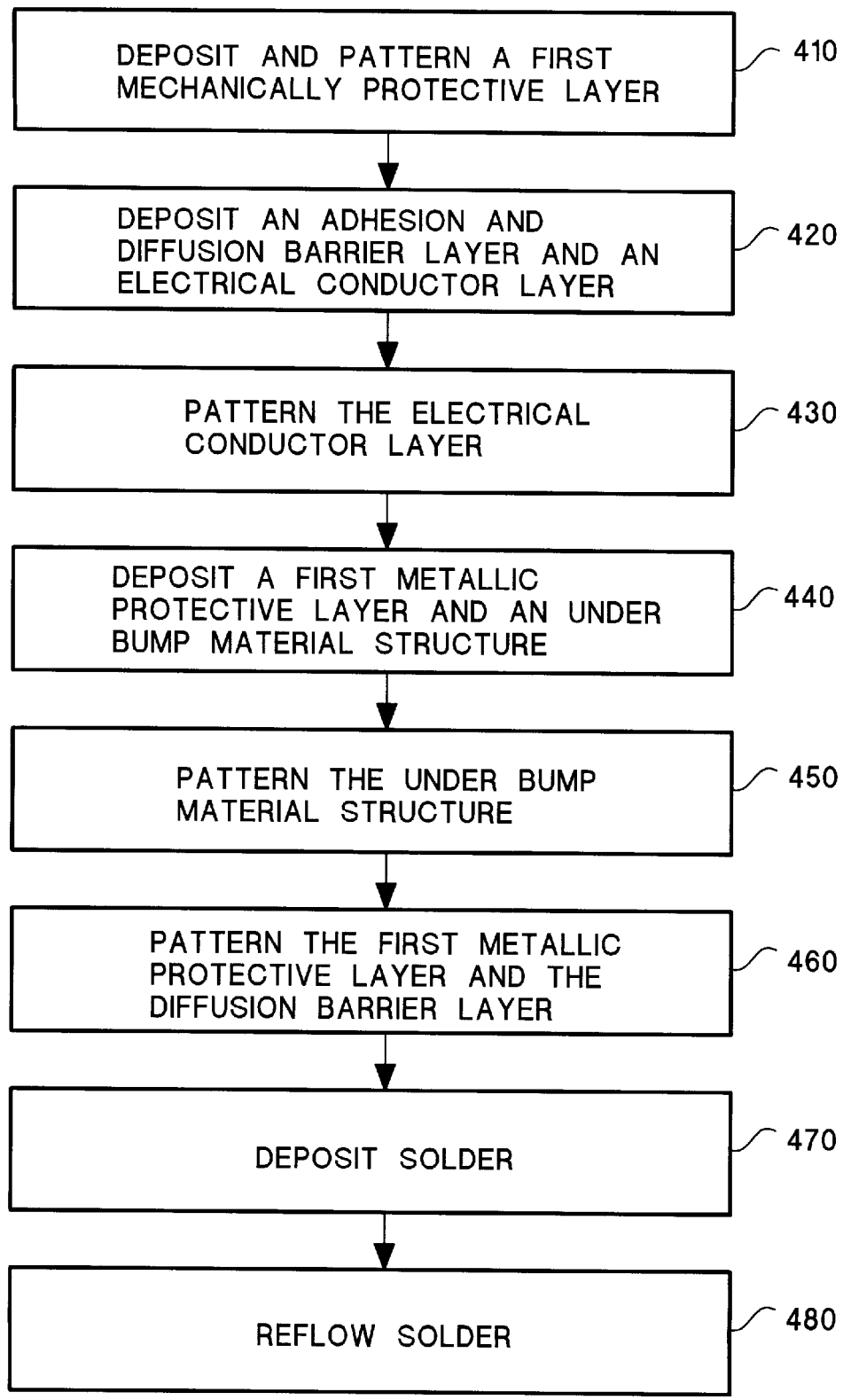
FIG. 4 is a flow chart showing steps of another method of forming an embodiment of the invention.

The electrical conductor layer for the method of forming an embodiment of the invention of FIG. 3 can be an Al—Cu alloy. However, if it is desired that the electrical conductor layer have better electrical qualities as offered by a Cu electrical conductor layer, another method of formation may be required. Cu for example, is not impervious to corrosion and must be sealed during the formation of the redistribution layer and the under bump material structure. FIG. 4 is a flow chart showing steps of another method of forming an embodiment of the invention in which the electrical conductor layer can be Cu.

A first step 410 includes depositing and patterning a first mechanically protective layer on an integrated circuit substrate. The first mechanically protective layer can be patterned by depositing and lithographically patterning a photoresist layer over the first mechanically protective layer. The first mechanically protective layer is then etched. As previously mentioned, the first mechanically protective layer is generally formed from polyimide which can be photosensitive.

A second step 420 includes depositing an adhesion and diffusion barrier layer and an electrical conductor layer. The adhesion and diffusion barrier layer and the electrical conductor layer can each be deposited by evaporation or sputtering. As previously mentioned, the adhesion and diffusion barrier layer can be formed from Ti, TiW, Cr or other materials having similar characteristics.

A variation of this method includes the deposition of the electrical conductor layer including depositing a thin conductor layer, depositing a patterned photoresist, electroplating the thin conductor layer to a desired thickness, and then removing the photoresist.

A third step 430 includes patterning the electrical conductor layer. The electrical conductor layer can be patterned by depositing and lithographically patterning a photoresist layer over the electrical conductor layer. The electrical conductor layer is then etched.

The fourth step 440 includes depositing a first metallic protective layer and an under bump material structure over the patterned electrical conductor layer and the adhesion and diffusion barrier layer. The result is that the electrical conductor layer is encapsulated between the adhesion and diffusion barrier layer and the first metallic protective layer. As previously stated, the under bump material structure includes a solder wettable metal layer formed over the redistribution layer and a second metallic protective layer. The first metallic protective layer, the solder wettable metal layer and the second metallic protective layer can be deposited through evaporation or sputtering.

As previously mentioned, the first metallic protective layer can be formed from Ti, TiW, Cr or other materials having similar characteristics, As previously stated, the under bump material structure includes a solder wettable metal layer formed over the redistribution layer and a second metallic protective layer. As previously stated, the solder wettable metal layer can be formed from Ni, NiV or a Ni alloy, and the second metallic protective layer can be formed from Au.

A fifth step 450 includes patterning the under bump material structure. The under bump material structure can be patterned by depositing and lithographically patterning a photoresist layer over the under bump material structure. The under bump material structure is then etched.

A sixth step 460 includes patterning the first metallic protective layer and the diffusion barrier layer. The first metallic protective layer and the diffusion barrier layer are patterned so that the electrical conductor layer remains encapsulated between the adhesion and diffusion barrier layer and the first metallic protective layer. Generally, this requires the pattern of the first metallic protective layer and the diffusion barrier layer to overlap the pattern of the electrical conductor layer.

A seventh step 470 includes depositing solder. The solder is deposited on the under bump material structure where solder bump are to be formed. The solder can be deposited by electroplating, evaporation or by printing a solder paste. These methods of depositing solder are well known in the art of semiconductor processing.

An eighth step 480 includes reflowing the deposited solder forming a solder bump on the under bump material structure.

Although specific embodiments of the invention have been described and illustrated, the invention is not to be limited to the specific forms or arrangements of parts so described and illustrated. The invention is limited only by the claims.

What is claimed is:

1. An integrated circuit redistribution structure comprising:
    a plurality of conductive pads mechanically bonded directly onto an active side of a substrate of an integrated circuit;
    a redistribution layer formed over the conductive pads and over the substrate, the redistribution layer comprising:
        a plurality of conductive lines, at least one conductive line connected to at least one conductive pad, the conductive lines each comprising:
            an adhesion and diffusion barrier layer;
            an electrical conductor layer formed over the adhesion and diffusion barrier layer; and
            a first metallic protective layer formed over the electrical conductor layer;
    the integrated circuit redistribution structure further comprising:
        an under bump material structure formed over the first metallic protective layer for receiving a solder bump, the under bump material structure electrically connected to at least one conductive line, the under bump material structure comprising:
            a solder wettable metal layer; and
            a second metallic protective layer formed over the solder wettable metal layer for receiving the solder bump.

2. The integrated circuit redistribution structure of claim 1, wherein at least one conductive line electrically connects at least one conductive pad to the solder bump received by the under bump material structure.

3. The integrated circuit redistribution structure of claim 1, wherein the redistribution layer further comprises a first mechanically protective layer adhering to the active side of the integrated circuit, the first mechanically protective layer comprising apertures corresponding to the conductive pads allowing electrical connections between the conductive lines and the conductive pads.

4. The integrated circuit redistribution structure of claim 1, further comprising a second mechanically protective layer adhering to the redistribution layer, the second mncchanically protective layer comprising apertures corresponding to the under bump material structure allowing electrical connection between the conductive lines and the solder bump.

5. The integrated circuit redistribution structure of claim 3, wherein the first mechanically protective layer comprises polyimide.

6. The integrated circuit redistribution structure of claim 1, wherein the adhesion and diffusion barrier layer comprises Ti.

7. The integrated circuit redistribution structure of claim 1, wherein the adhesion and diffusion barrier layer comprises TiW.

8. The integrated circuit redistribution structure of claim 1, wherein the adhesion and diffusion barrier layer comprises Chromium.

9. The integrated circuit redistribution structure of claim 1, wherein the electrical conductor layer comprises aluminum.

10. The integrated circuit redistribution structure of claim 1, wherein the electrical conductor layer comprises an aluminum and copper alloy.

11. The integrated circuit redistribution structure of claim 1, wherein the electrical conductor layer comprises copper.

12. The integrated circuit redistribution structure of claim 1, wherein the first metallic protective layer comprises Ti.

13. The integrated circuit redistribution structure of claim 1, wherein the first metallic protective layer comprises TiW.

14. The integrated circuit redistribution structure of claim 1, wherein the first metallic protective layer comprises Chromium.

15. The integrated circuit redistribution structure of claim 1, wherein the solder wettable metal layer comprises nickel.

16. The integrated circuit redistribution structure of claim 1, wherein the solder wettable metal layer comprises a nickel alloy.

17. The integrated circuit redistribution structure of claim 1, wherein the solder wettable metal layer comprises NiV.

18. The integrated circuit redistribution structure of claim 1, wherein the second metallic protective layer comprises gold.

19. The integrated circuit redistribution structure of claim 1, wherein the second mechanically protective layer comprises polyimide.

* * * * *